(12) United States Patent
Pursel et al.

(10) Patent No.: US 6,384,618 B1
(45) Date of Patent: May 7, 2002

(54) CHIP SCALE ELECTRICAL TEST FIXTURE WITH ISOLATION PLATE HAVING AN ANGLED TEST HOLE

(75) Inventors: John W. Pursel, Sunnyvale; John Vu, San Jose; Nhon T. Do, Mountain View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/525,475

(22) Filed: Mar. 15, 2000

(51) Int. Cl.[7] .................................................. G01R 1/04
(52) U.S. Cl. ....................................... 324/765; 324/755
(58) Field of Search ................................. 324/755, 754, 324/761, 765; 439/66–71, 620

(56) References Cited

U.S. PATENT DOCUMENTS 4,668,041 A * 5/1987 La Komski et al. ........ 439/620
5,929,649 A * 7/1999 Cramer ........................ 324/761
5,959,462 A * 9/1999 Lum ............................ 324/765

* cited by examiner

Primary Examiner—Vinh P. Nguyen

(57) ABSTRACT

A test fixture with an isolation plate grounds all of the solder balls of a ball grid array (BGA) of a chip scale package, except for a selected subset of the solder balls, to perform electrical characterization of the package. The isolation plate includes at least one hole extending through the isolation plate that exposes the selected subset of the electrical contacts. The hole has a sidewall angled at a non-perpendicular angle from the horizontal plane of the isolation plate. The angle sidewall of the hole provides increased clearance for a fixed compliant probe to land on the solder balls to be tested in an electrical characterization process.

17 Claims, 4 Drawing Sheets

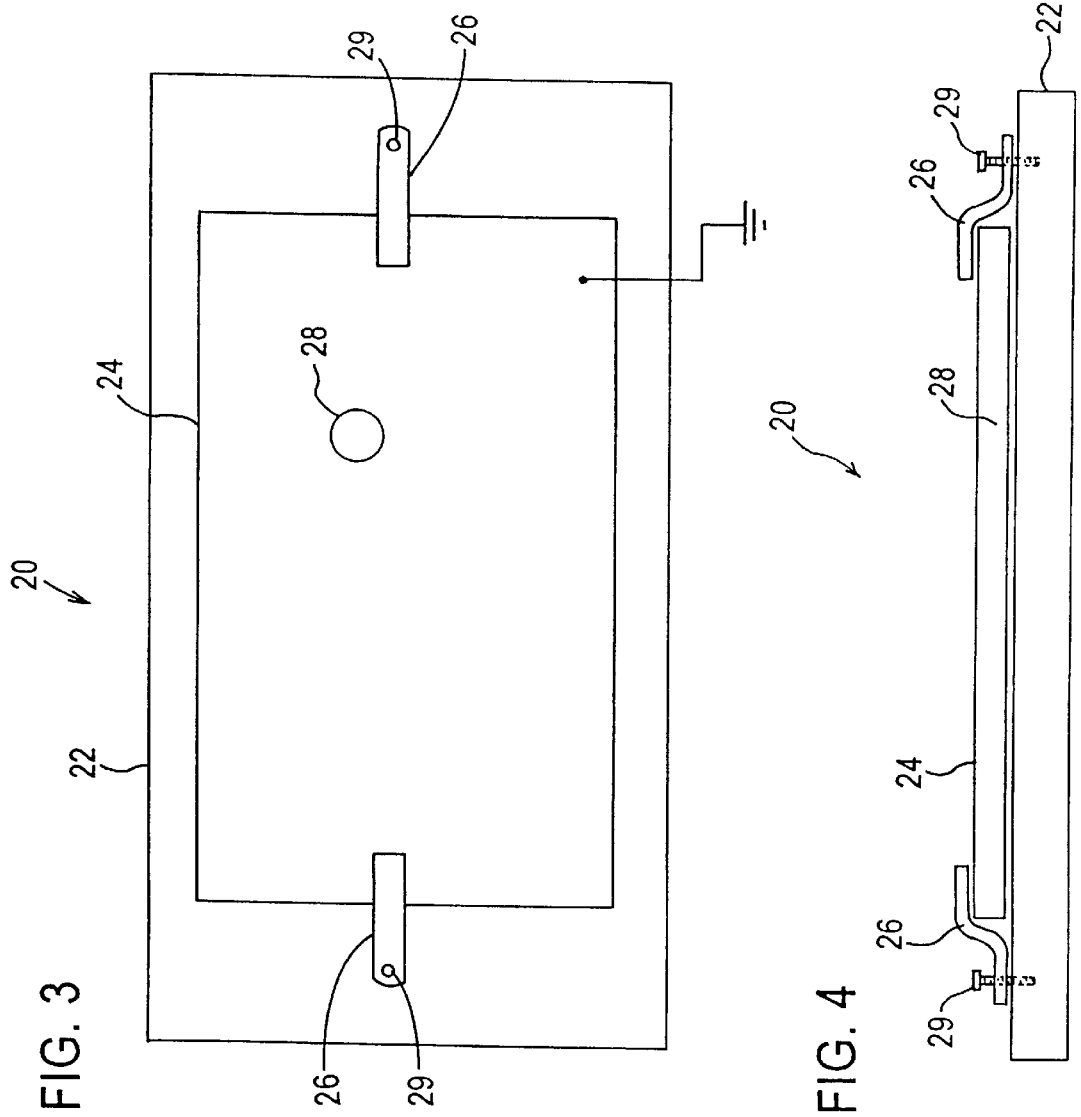

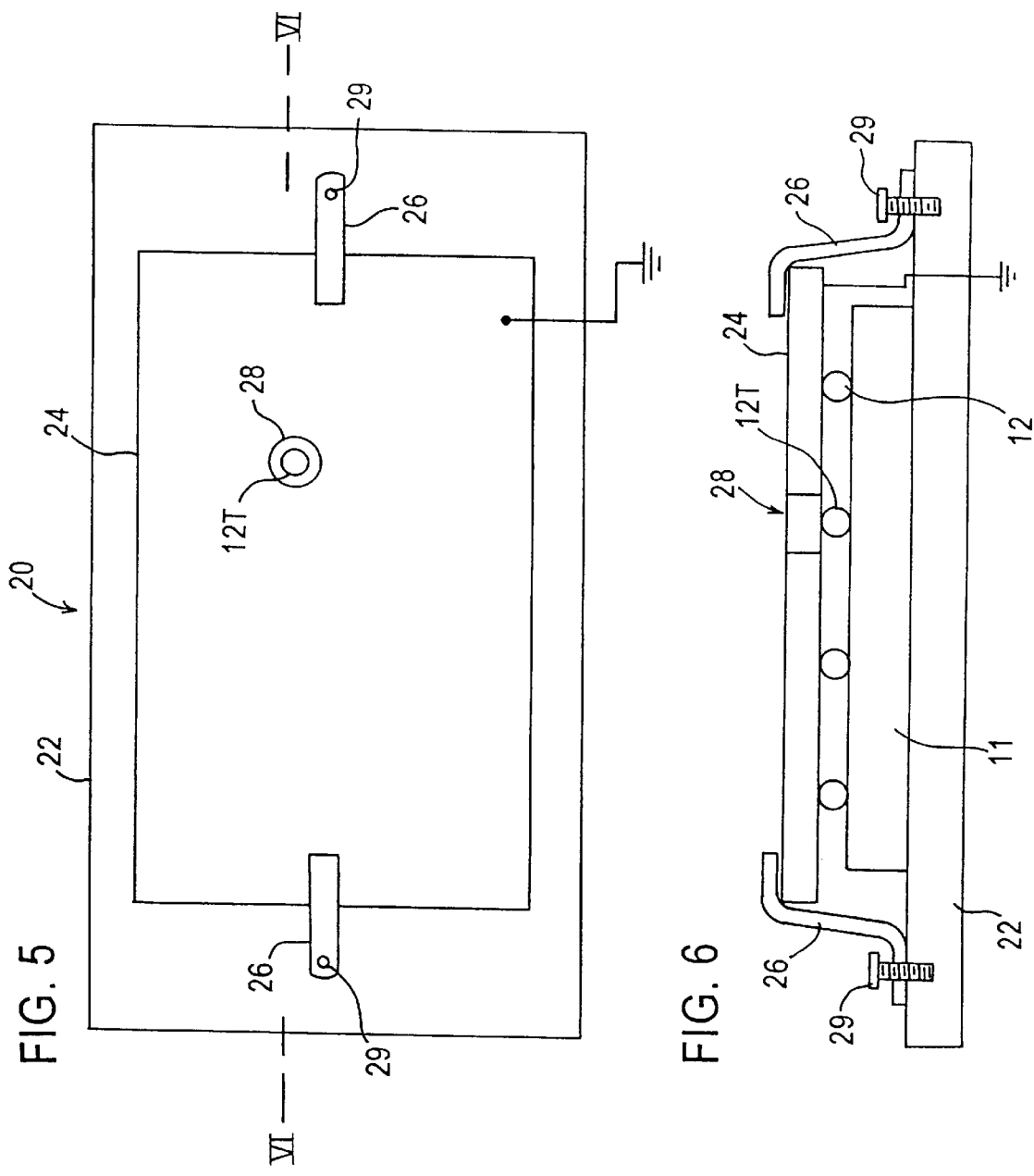

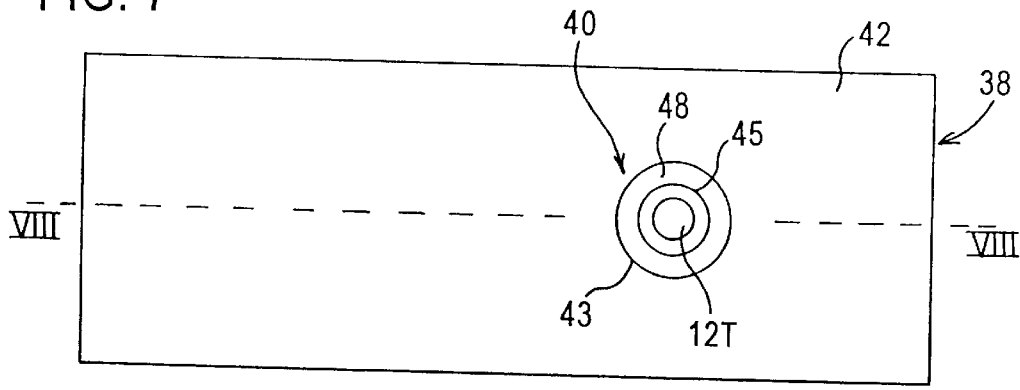
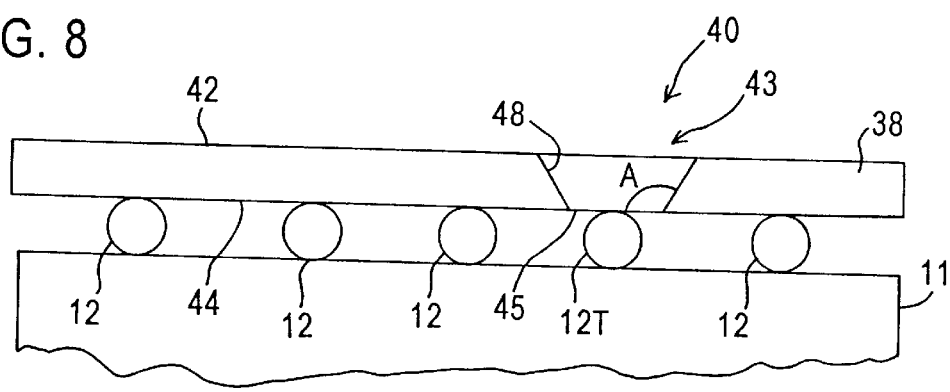
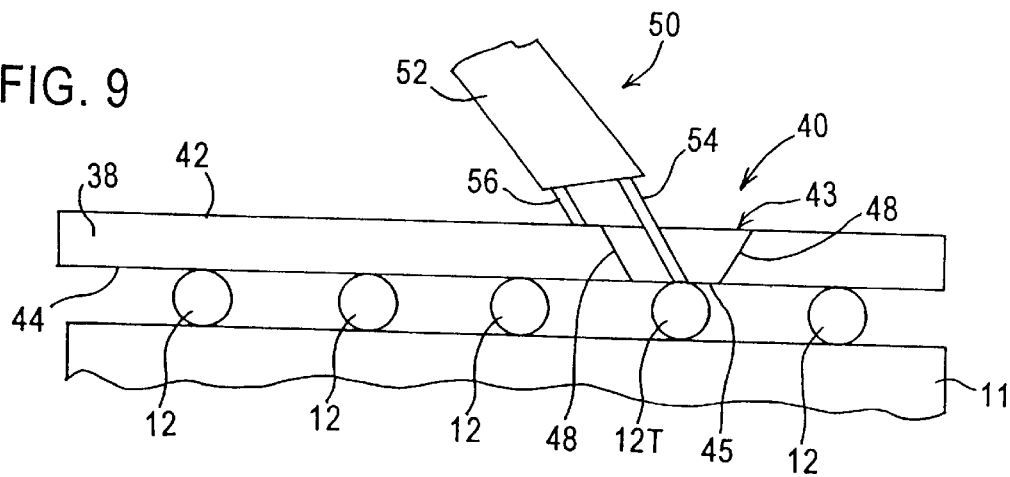

CHIP SCALE ELECTRICAL TEST FIXTURE WITH ISOLATION PLATE HAVING AN ANGLED TEST HOLE

RELATED APPLICATIONS

This application contains subject matter similar to that disclosed in commonly assigned U.S. patent application Ser. No. 09/563,489, filed on May 3, 2000, for a CHIP SCALE ELECTRICAL TEST FIXTURE and U.S. patent application Ser. No. 09/563,497, filed on May 3, 2000 for a CHIP SCALE ELECTRICAL TEST FIXTURE WITH ISOLATION PLATE HAVING A RECESS.

FIELD OF THE INVENTION

The present invention relates to the testing of integrated circuits, and in particular, to the electrical characterization of a chip scale package.

DESCRIPTION OF RELATED ART

Electrical components utilizing integrated circuit chips are used in a number of applications. Controlled Collapsed Chip Connection is an interconnect technology developed as an alternative to wire bonding. This technology is generally known as C4 technology, or flip chip packaging. Broadly stated, one or more integrated circuit chips are mounted above a single or multiple layer substrate and pads on the chip are electrically connected to corresponding pads on a substrate by a plurality of electrical connections, such as solder bumps. The integrated circuit chips may be assembled in an array such as a 10×10 array. A substrate is then electrically connected to another electronic device such as a circuit board with the total package being used in an electronic device such as a computer.

It is desirable to perform an electrical characterization of an integrated circuit by measuring inductance (L), capacitance (C), and resistance (R) at electrical contacts of the integrated circuit. This has presented a problem, however, when measuring these parameters for a "chip scale package". Semiconductor dice, or chips, are typically individually packaged for use in plastic or ceramic packages. This is sometimes referred to as the first level of packaging. The package is required to support, protect, and dissipate heat from the die and to provide a lead system for power and signal distribution to the die. The package is also useful for performing burn-in and functionality testing of the die.

One type of semiconductor package is referred to as a "chip scale package". Chip scale packages are also referred to as "chip size packages", and the dice are referred to as being, "minimally packaged". Chip scale packages can be fabricated in "uncased" or "cased" configurations. Uncased chip scale packages have a footprint that is about the same as an unpackaged die. Cased chip scale packages have a peripheral outline that is slightly larger than an unpackaged die. For example, a footprint for a typical cased chip scale package can be about 1.2 times the size of the die contained within the package.

Typically, a chip scale package includes a substrate bonded to the face of the die. The substrate includes the external contacts for making outside electrical connections to the chip scale package. The substrate for a chip scale package can comprise flexible material, such as a polymer tape, or a rigid material, such as silicon, ceramic, or glass. The external contacts for one type of chip scale package includes solder balls arranged in a dense array, such as a ball grid array "BGA," or a fine ball grid array "FBGA." These dense arrays permit a high input/output capability for the chip scale package. For example, a FBGA on a chip scale package can include several hundred solder balls.

In order to test the electrical characteristics of the integrated circuit, test probes are used to contact individual solder balls. Performing precise measurements of the electrical characteristics on a chip scale package is very difficult, however, due to the dimensions. It is hard to isolate a single solder ball or other electrical contact, while grounding the remainder of the solder balls. Hence, isolation and testing of a single, selected solder ball of an integrated circuit has proven to be a difficult task.

SUMMARY OF THE INVENTION

There is a need for a test fixture that is able to isolate a single electrical contact (e.g., solder ball) on a chip scale package, while grounding all of the remaining solder balls on the chip scale package. Such a test fixture permits proper isolation of the solder ball under test for determining electrical characteristics at the solder ball.

These and other needs are met by embodiments of the present invention which provide a test fixture for holding, for electrical characteristic testing, an integrated circuit chip having a plurality of electrical contacts. The test fixture comprises a base, an isolation plate, and a holding device configured to hold the isolation plate against the base with an integrated circuit under test between the base and the isolation plate, wherein the isolation plate is a flat plate with a bottom surface configured to contact and ground all of the plurality of electrical contacts of the integrated circuit under test except for a selected subset of the electrical contacts. The isolation plate includes at least one hole extending through the isolation plate. The hole exposes the selected subset of the electrical contacts, and has a sidewall angled at a non-perpendicular angle from the horizontal plane of the isolation plate.

One of the advantages of the present invention is the increased access provided by the angled sidewall for needle probes to land on the electrical contacts that are to be tested. The hole can be readily formed in an isolation plate, by a milling or boring of the plate to produce the angled sidewall. This configuration allows a fixed compliant probe, such as those manufactured by Cascade Microwave, Inc., of Beaverton Oregon, to securely land on the contact within the hole, as well as on the grounded top surface of the isolation plate. This produces more reliable testing of a chip scale package.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 is a top view of a test fixture constructed in accordance with embodiments of the present invention.

FIG. 4 is a side view of the test fixture of FIG. 3.

FIG. 5 is a top view of the test fixture of FIG. 3 with a chip scale package under test inserted within the test fixture according to the method of the present invention.

FIG. 6 is a cross-section of the test fixture of FIG. 5 with the inserted chip scale package under test, taken along line VI—VI.

FIG. 7 is a top view of an isolation plate for use with a test fixture, such as the exemplary test fixture of FIG. 3, according to an embodiment of the present invention.

FIG. 8 is a side view of the isolation plate of FIG. 7.

FIG. 9 is a side view of the isolation plate of FIG. 7, with a fixed compliant probe applied to a contact and the isolation plate.

DETAILED DESCRIPTION OF THE INVENTION

The present invention addresses and solves problems related to the isolation of one or more solder balls in a chip scale package for electrical characteristic testing and provides an arrangement that allows more reliable testing of a chip scale package. This is achieved, in part, by a test fixture that has a conductive isolation plate configured to contact all of the electrical contacts (e.g., solder balls) on the chip scale package, except for a selected subset of contacts at which testing occurs. To provide access to the contacts for testing, one or more holes are formed in the isolation plate. The holes are centered over the contacts when the conductive isolation plate is placed over the chip scale package. The holes have angled sidewalls that make it easier for a test probe to land on the electrical contact of interest, thereby making electrical characterization of the chip scale package a more reliable and simpler procedure to perform.

Prior to discussing an embodiment of the present invention in which holes with angled sidewalls are provided in an isolation plate, an exemplary test fixture that may be used for electrical characterization of a chip scale package will be described. However, the present invention may be used with other test fixtures and testing procedures in which a plurality of electrical contacts are to be simultaneously grounded and increased probe access to the electrical contact is desirable.

Figure 1:
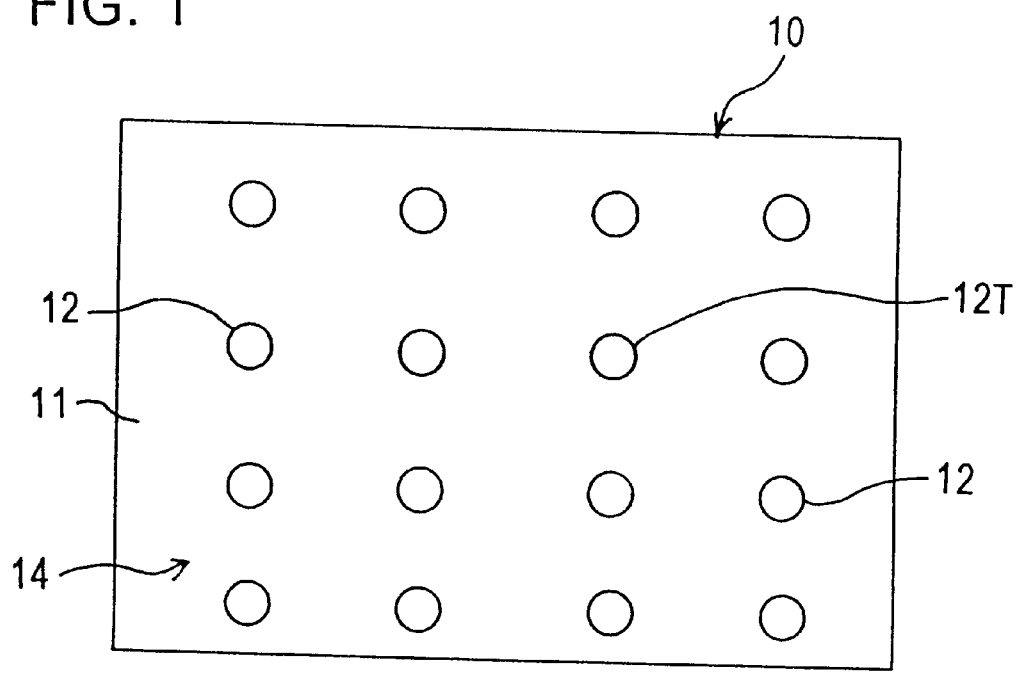
FIG. 1 is an enlarged, schematic top view of an exemplary chip scale package.

An exemplary embodiment of the chip scale package 10 is depicted in top view in FIG. 1. The chip scale package 10 includes a substrate 11, containing the integrated circuitry and/or interconnections. The circuitry is connected to a plurality of electrical contacts 12 formed on one side of the chip scale package 10. In preferred embodiments of the invention, the electrical contacts are formed by substrate balls 12 and are arranged in array 14. Thus, the solder balls form a ball grid array 14. Although depicted for illustration purposes in FIG. 1 as being relatively spread apart, in practice, the substrate balls 12 are very tightly packed on a chip scale package 10 in the ball grid array 14. Thus, it is difficult to isolate one of the solder balls 12 for electrical characteristic testing.

Figure 2:
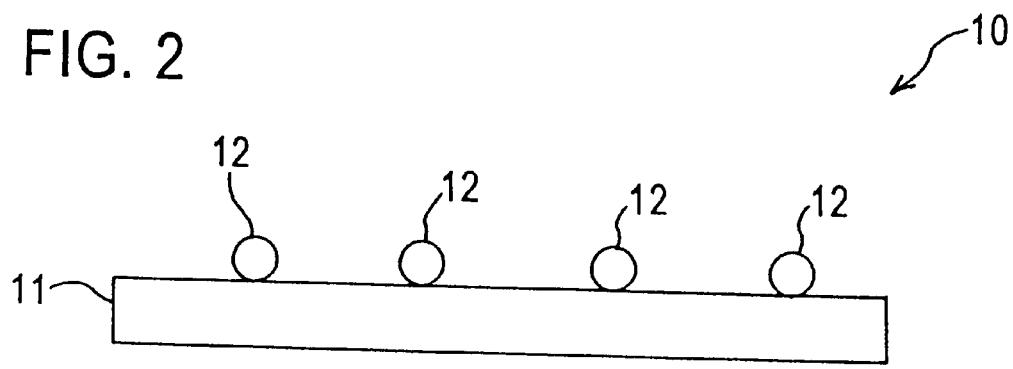
FIG. 2 is a side view of the chip scale package of FIG. 1.

A side view of the chip scale package 10 is provided in FIG. 2. As can be seen from this figure, the electrical contacts or balls extend from only one side of the chip scale package 10. One or more of these solder balls 12 will be a solder ball at which testing is desired. This solder ball to be tested is designated in FIGS. 1 and 2 as 12T. With the remaining balls it is often desirable to ground the remaining balls 12 on the chip scale package 10, at the same time isolating the ball 12T under test.

FIG. 3 is a top view of a test fixture constructed in accordance with embodiments of the present invention. This test fixture is elegant in construction and relatively inexpensive to create. At the same time, however, it provides a thorough grounding of all of the electrical contacts of the chip scale package 10, allowing an isolated subset of the electrical contacts to be tested for electrical characterization.

The test fixture 20 of FIG. 3 includes a base 22 made of either conductive or non-conductive material. For example, the base 22 may be made of a metal or may be made of a ceramic or carbon-fiber composite, or any other suitable material. The base 22 is generally planar in shape with a smooth surface so as not to damage a chip scale package placed on the surface of the base 22.

A conductive isolation plate 24, which serves as a grounding plate, is placed over the base 22. Generally, the isolation plate 24 is smaller in area than the base 22 and is substantially planar. The isolation plate 24 is a conductive plate, and is therefore made of a highly conductive material, such as a conductive metal. The isolation plate 24 is coupled to ground.

The isolation plate 24 is held against the base 22 by a pair of clamps 26 in the illustrated embodiment of FIG. 3. Other holding devices, such as elastomeric hold-down devices, replace the lamps 26 in other embodiments of the invention. The clamping, pressure applied against the isolation late 24 is adjusted by an adjustment device 29, such as a screw. The adjustment device 29, e.g., a screw, is attached to the base 22.

The isolation plate 24 has a test hole 28 provided at a desired location on the surface of the isolation plate 24. Test hole 28 extends through the isolation plate 24 and is dimensioned so that it is slightly larger than the electrical contact or solder ball 12 of a chip scale package 10. The embodiment of FIG. 3 depicts a single test hole 28, but a plurality of test holes may be provided in isolation plate 24. This would provide access to a plurality of selected balls 12T for testing the electrical characteristics of the chip scale package 10 at these balls 12T. In the embodiment of FIG. 3, however, only a single test hole 28 is depicted.

FIG. 4 is a side view of the test fixture 20 of FIG. 3. The chip scale package 10 is inserted between the isolation plate 24 and the base 22. The clamps 26 may be removed and the isolation plate 24 completely removed from the test fixture 20 prior to the positioning of the chip scale package 10 to be tested. The isolation plate 24 is then placed carefully onto the chip scale package 10 and the clamps 26 tightened through the adjustment device 29.

FIG. 5 depicts the test fixture 20 of FIG. 3, but with a chip scale package 10 inserted in the test fixture 20. The chip scale package 10 is properly positioned on the base 22 and the isolation plate 24 is properly positioned on a chip scale package 10 such that the desired solder balls 12T to be tested fall completely within the test hole 28. If more than one solder ball is to be tested, additional test holes 28 are provided in the isolation plate 24. The clamping pressure applied by the adjustment devices 29, as depicted in FIG. 6, is enough to ensure proper contact of the isolation plate 24 against each of the solder balls 12, but not enough to damage the solder balls 12. With proper contact of the solder balls 12 that are not under test to the isolation plate 24, and the grounding of this isolation plate 24, the solder balls 12 that are not under test are all properly grounded.

The subset of electrical contacts or solder balls 12T that are under test are exposed through the test hole or holes 28 in the isolation plate 24. The dimensioning of the test hole 28 in the isolation plate 24 is slightly larger than the solder ball under test 12. This ensures that the solder ball under test 12T does not contact the conductive isolation plate 24. The test hole 28 needs to be large enough, however, to allow a test probe (not shown) to access the solder ball under test 12T without contacting the isolation plate 24. When the test probe is able to establish contact with the ball under test 12T, the electrical characteristics, such as inductance, capacitance, and resistance at the ball under test 12T, which has been effectively isolated from the other balls 12 on the chip scale package 10, may be ascertained.

Although the isolation plate 24 of FIGS. 3–6 is adequate to ground the electrical contacts 12 and isolate a solder ball 12T that is to be tested, a further improvement in the isolation plate that provides greater clearance for a test probe to ease and assure landing of the probe on the solder ball 12T is desirable. To that end, FIGS. 7–9 depict another embodiment of an isolation plate 38 that may be used in the test fixture 20 of FIG. 3, replacing the isolation plate 24. It will be appreciated that the isolation plate 38 of FIGS. 7–9 may be used in conjunction with other test fixtures, as the description that follows is exemplary and not restrictive.

FIG. 7 is a top view of an isolation plate 38 constructed in accordance with embodiments of the present invention. The isolation plate 38 has a hole 40, as best seen in the side view of FIG. 8. The hole 40 may be formed by grinding, milling or boring of the isolation plate 38, for example, from the top surface 42 of the isolation plate 38. This removal process leaves a hole 40 with a top surface opening 43 and a bottom surface opening 45 that is smaller than the top surface opening 43. The bottom surface opening 45 is slightly larger, in certain embodiments than the diameter of a solder ball 12T. In other embodiments, the bottom surface opening 45 is smaller than the ball diameter, but larger than the diameter of a signal portion of a probe.

As seen in FIG. 8, the isolation plate 38 has a bottom surface 44 that is generally smooth and contacts the tops of all of the solder balls 12 that are to be grounded. The hole 40 is positioned in the isolation plate 38 to be located over a solder ball 12T under test when the isolation plate 38 is properly oriented in a test fixture.

The hole 40 has an angled sidewall or sidewalls 48. The angling of the sidewall 48 provides easier access at an angle by a needle probe to the solder ball 12T under test than the perpendicular walls of the cylinder shaped hole 28 of the embodiment of FIGS. 3–6. The hole 28 is adequate for use with needle probes that are perpendicularly directed, while the hole 40, with angled sidewalls 48, allows the needle probes to approach the solder ball 12T under test at an angle.

The sidewall 48 may be angled at a non-perpendicular angle A from between about 100° to about 160° in certain embodiments, or 130° to about 145° in other embodiments, or 135° to about 140° in preferred embodiments. The angling of the sidewall 48 within such angle ranges provides easier access to the ball under test by probes approaching at an angle.

FIG. 9 is a depiction of the isolation plate of FIG. 8, illustrating an exemplary needle probe 50 in operation. The needle probe 50 has a cable 52 with an inner conductor and an outer conductor. The inner conductor is coupled to the signal portion 54 of the needle probe 50, and the ground portion 56 is coupled to the outer conductor. The ground portion 56 lands on the top surface 42 of the isolation plate 38 and is grounded thereby. The signal portion 54 of the probe 50 extends through the larger top surface opening 43 of the hole 40 and the smaller bottom surface opening 45, to establish contract with the solder ball 12T under test. Once the signal portion 54 and the ground portion 56 are in contact with the solder ball 12T and the top surface 42 of the isolation plate, respectively, the electrical characterization process may proceed. As can be appreciated from FIG. 9, the larger, top surface opening 43 and angled sidewall 48 of the hole 40 permits the needle probe to approach at a non-perpendicular angle with respect to the plane of the isolation plate 38.

The present invention provides a test fixture with an isolation plate that securely grounds all of the electrical contacts that are to be grounded and isolates those contacts that are to be tested during an electrical characterization process. The invention permits allows non-perpendicular access to the contacts under test by needle probes used in the electrical characterization process, making landing of the needle probe on the contacts under test an easier task.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A test fixture for holding, for electrical characteristic testing, an integrated circuit chip having a plurality of electrical contacts, the test fixture comprising:

a base;

an isolation plate; and a holding device configured to hold the isolation plate against the base with an integrated circuit under test between the base and the isolation plate;

wherein the isolation plate is a flat plate with a bottom surface configured to contact and ground all of the plurality of electrical contacts of the integrated circuit under test except for a selected subset of the electrical contacts, the isolation plate including at least one hole extending through the isolation plate and that exposes the selected subset of the electrical contacts, the hole having a sidewall angled at a non-perpendicular angle from the horizontal plane of the isolation plate.

2. The test fixture of claim 1, wherein the base is planar.

3. The test fixture of claim 2, wherein each hole in the isolation plate exposes only a single one of the electrical contacts.

4. The test fixture of claim 3, wherein the sidewall tapers inwardly from an opening at a top surface of the isolation plate to an opening at the bottom surface of the isolation plate, the opening in the bottom surface of the isolation plate being dimensioned to be slightly larger than each exposed electrical contact.

5. The test fixture of claim 4, wherein the selected subset of the electrical contacts consists of a single electrical contact.

6. The test fixture of claim 5, wherein the electrical contacts are balls.

7. The test fixture of claim 4, wherein the non-perpendicular angle is between about 100° and about 160°.

8. The test fixture of claim 4, wherein the non-perpendicular angle is between about 130° and about 145°.

9. The test fixture of claim 4, wherein the non-perpendicular angle is between about 135° and about 140°.

10. The test fixture of claim 4, wherein the top surface of the isolation plate is a probe contact surface configured to ground a ground portion of a needle probe when a signal portion of the needle probe contacts the electrical contact through the hole.

11. The test fixture of claim 1, wherein the isolation plate is a grounded metal plate.

12. The test fixture of claim 1, wherein the holding device includes a clamp attached to the base at one end of the clamp, with a free end contacting the isolation plate.

13. The test fixture of claim 12, further comprising an adjustment mechanism for adjusting the clamping force of the clamp against the isolation plate to thereby adjust the pressure exerted by the isolation plate against an integrated circuit under test between the isolation plate and the base.

14. The test fixture of claim 13, wherein the adjustment mechanism is a screw.

15. The test fixture of claim 1, wherein the non-perpendicular angle is between about 100° and about 160°.

16. The test fixture of claim 1, wherein the non-perpendicular angle is between about 130° and about 145°.

17. The test fixture of claim 1, wherein the non-perpendicular angle is between about 135° and about 140°.

* * * * *